United States Patent
You et al.

(10) Patent No.: US 12,225,777 B2
(45) Date of Patent: Feb. 11, 2025

(54) PIXEL REGIONS HAVING CURVED SURFACES BETWEEN FIRST AND SECOND DEFINITION LAYERS

(71) Applicant: BOE Technology Group Co., Ltd., Beijing (CN)

(72) Inventors: Juanjuan You, Beijing (CN); Ying Cui, Beijing (CN); Yue Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 479 days.

(21) Appl. No.: 17/629,026

(22) PCT Filed: Apr. 23, 2021

(86) PCT No.: PCT/CN2021/089327
§ 371 (c)(1),
(2) Date: Jan. 21, 2022

(87) PCT Pub. No.: WO2021/233070
PCT Pub. Date: Nov. 25, 2021

(65) Prior Publication Data
US 2022/0320205 A1    Oct. 6, 2022

(30) Foreign Application Priority Data
May 22, 2020   (CN) .......................... 202010441530.5

(51) Int. Cl.
*H10K 59/122* (2023.01)
*H01L 23/538* (2006.01)
(Continued)

(52) U.S. Cl.
CPC ....... *H10K 59/122* (2023.02); *H01L 23/5387* (2013.01); *H10K 59/40* (2023.02);
(Continued)

(58) Field of Classification Search
CPC .... H10K 59/122; H10K 59/40; H10K 59/353; H10K 71/00; H10K 71/135; H10K 71/231; H01L 23/5387
See application file for complete search history.

(56) References Cited

U.S. PATENT DOCUMENTS

| 10,345,639 B1 | 7/2019 | Nakagawa | |
| 2016/0087022 A1* | 3/2016 | Tsai | H10K 59/1216 257/40 |

(Continued)

FOREIGN PATENT DOCUMENTS

| CN | 103928497 A | 7/2014 |
| CN | 105576002 A | 5/2016 |

(Continued)

OTHER PUBLICATIONS

CN202010441530.5 second office action.
CN 202010441530.5 first office action.

*Primary Examiner* — Alonzo Chambliss
(74) *Attorney, Agent, or Firm* — IPro, PLLC

(57) ABSTRACT

A display base plate includes: a substrate (101), a first electrode layer (102) formed on the substrate (101), and a first pixel definition layer (103) and a second pixel definition layer (104) formed on the first electrode layer (102); the first pixel definition layer (103) divides the substrate (101) into a plurality of pixel regions (105), each pixel region (105) includes a plurality of subpixel regions (1050) distributed along a first direction, and two adjacent subpixel regions (1050) are separated by the second pixel definition layer (104); in the first direction, surfaces of each pixel region (105) in contact with the first pixel definition layer (103) include a plurality of first curved surfaces (1061) and a plurality of second curved surfaces (1062), and the first curved surfaces (1061) and the second curved surfaces (1062) are protruded away from the pixel region (105) to which they belong.

18 Claims, 4 Drawing Sheets

(51) Int. Cl.
*H10K 59/40* (2023.01)
*H10K 71/00* (2023.01)
*H10K 71/13* (2023.01)
*H10K 71/20* (2023.01)
*H10K 59/12* (2023.01)
*H10K 102/00* (2023.01)

(52) U.S. Cl.
CPC ........... *H10K 71/00* (2023.02); *H10K 71/135* (2023.02); *H10K 71/231* (2023.02); H10K 59/1201 (2023.02); H10K 2102/311 (2023.02)

(56) References Cited

U.S. PATENT DOCUMENTS

| | | |
|---|---|---|
| 2016/0254331 A1 | 9/2016 | Wang |
| 2018/0315800 A1 | 11/2018 | Iguchi et al. |
| 2019/0044077 A1 | 2/2019 | Zhang |
| 2020/0219967 A1 | 7/2020 | Lou et al. |
| 2020/0243621 A1 | 7/2020 | Zhao |
| 2021/0109624 A1 | 4/2021 | Lee et al. |
| 2021/0134894 A1 | 5/2021 | Peng et al. |
| 2022/0336541 A1* | 10/2022 | Niu ............... H10K 59/352 |
| 2023/0225169 A1* | 7/2023 | Yan ............... H10K 71/00 257/40 |

FOREIGN PATENT DOCUMENTS

| | | | | |
|---|---|---|---|---|
| CN | 106449717 A | | 2/2017 | |
| CN | 106935632 A | | 7/2017 | |
| CN | 107068722 A | | 8/2017 | |
| CN | 107819019 A | | 3/2018 | |
| CN | 108807419 A | | 11/2018 | |
| CN | 108807457 A | | 11/2018 | |
| CN | 110767672 A | | 2/2020 | |
| CN | 111463256 A | | 7/2020 | |
| CN | 111799384 A | * | 10/2020 | ........... G03F 7/0002 |
| CN | 211654826 U | | 10/2020 | |

* cited by examiner

PIXEL REGIONS HAVING CURVED SURFACES BETWEEN FIRST AND SECOND DEFINITION LAYERS

CROSS REFERENCE TO RELEVANT APPLICATIONS

The present application claims the priority of the Chinese patent application filed on May 22, 2020 before the Chinese Patent Office with the application number of 202010441530.5 and the title of "DISPLAY SUBSTRATE AND MANUFACTURING METHOD THEREFOR, AND DISPLAY PANEL AND DISPLAY APPARATUS", which is incorporated herein in its entirety by reference.

TECHNICAL FIELD

The present disclosure relates to the technical field of display, and in particularly relates to a display base plate and a manufacturing method thereof, a display panel and a display apparatus.

BACKGROUND

Compared with liquid crystal display (LCD), organic light-emitting diode (OLED) has advantages of self-luminescence, fast response, wide viewing angle, high luminance, bright color, thin and light, etc. It is considered to be the next generation display technology. The thin film deposition methods of OLED mainly include vacuum evaporation and solution process. The inkjet printing process in the solution process is considered to be an important way to achieve mass production of large-size OLED due to its high utilization rate and it is capable to realize large size.

SUMMARY

The embodiments of the present disclosure provide a display base plate and a manufacturing method therefor, a display panel and a display apparatus.

The present disclosure provides a display base plate, and the display base plate comprises: a substrate, a first electrode layer formed on the substrate, and a first pixel definition layer and a second pixel definition layer formed on the first electrode layer;
  the first pixel definition layer divides the substrate into a plurality of pixel regions, each of the plurality of pixel regions comprises a plurality of subpixel regions distributed along a first direction, and two adjacent instances of the plurality of subpixel regions are separated by the second pixel definition layer; and
  in the first direction, surfaces of each of the plurality of pixel regions in contact with the first pixel definition layer comprise a plurality of first curved surfaces and a plurality of second curved surfaces, the plurality of first curved surfaces are connected to each other, the plurality of second curved surfaces are connected to each other, and the plurality of first curved surfaces and the plurality of second curved surfaces are protruded away from the pixel region to which they belong.

Optionally, the second pixel definition layer comprises first pixel definition structures and second pixel definition structures disposed in each of the plurality of pixel regions;
  each of the first pixel definition structures is disposed between the first curved surface and the second curved surface, and located at a maximum spacing between the first curved surface and the second curved surface along a second direction, and the second direction is perpendicular to the first direction; and
  one end of each of the second pixel definition structures is located at a connection position of two adjacent instances of the plurality of first curved surfaces, the other end of each of the second pixel definition structures is located at a connection position of two adjacent instances of the plurality of second curved surfaces, and a line connecting two ends of each of the second pixel definition structures is located in the second direction.

Optionally, for a same pixel region, any two adjacent instances of the plurality of first curved surfaces are connected directly, and two adjacent instances of the plurality of second curved surfaces are connected directly; and
  the two ends of each of the second pixel definition structures are in contact with the first curved surface and the second curved surface, and located at a minimum spacing between the first curved surface and the second curved surface along the second direction.

Optionally, for a same pixel region, any two adjacent instances of the plurality of first curved surfaces are connected by a first connection part, any two adjacent instances of the plurality of second curved surfaces are connected by a second connection part; the two ends of each of the second pixel definition structures are contact with the first connection part and the second connection part;
  wherein, orthographic projections of the first connection part and the second connection part on the substrate are straight line segments distributed along the first direction.

Optionally, in the first direction, a width of each of the second pixel definition structures is greater than or equal to widths of the first connection part and the second connection part.

Optionally, in a direction perpendicular to the substrate, and a thickness of the second pixel definition layer is less than a thickness of the first pixel definition layer.

Optionally, the thickness of the first pixel definition layer is 1.5 µm to 3 µm, and the thickness of the second pixel definition layer is less than or equal to 1 µm.

Optionally, quantities of the first curved surfaces and the second curved surfaces of each of the plurality of pixel regions in contact with the first pixel definition layer are greater than or equal to 2.

Optionally, the first curved surfaces and the second curved surfaces are disposed correspondingly, and orthographic projections of the first curved surfaces and the second curved surfaces on the substrate are circular arc shapes.

Optionally, for a same pixel region, quantities of the first curved surfaces and the second curved surfaces are equal, and radiuses of curvature corresponding to the orthographic projections of the first curved surfaces and the second curved surfaces on the substrate are equal.

The present disclosure further provides a display panel, and the display panel comprises the above display base plate.

Optionally, the display panel further comprises an organic functional layer formed in each of the plurality of subpixel regions, a cathode covering the organic functional layer, the first pixel definition layer and the second pixel definition layer, and an encapsulation layer.

The present disclosure further provides a display apparatus, and the display apparatus comprises the above display panel.

The present disclosure further provides a manufacturing method of a display base plate, and the method comprises:

providing a substrate;

forming a first electrode layer on the substrate;

forming a first pixel definition layer and a second pixel definition layer on the first electrode layer;

wherein, the first pixel definition layer divides the substrate into a plurality of pixel regions, each of the plurality of pixel regions comprises a plurality of subpixel regions distributed along a first direction, and two adjacent instances of the plurality of subpixel regions are separated by the second pixel definition layer; in the first direction, surfaces of each of the plurality of pixel regions in contact with the first pixel definition layer comprise a plurality of first curved surfaces and a plurality of second curved surfaces, the plurality of first curved surfaces are connected to each other, the plurality of second curved surfaces are connected to each other, and the plurality of first curved surfaces and the plurality of second curved surfaces are protruded away from the pixel region to which they belong.

Optionally, the first pixel definition layer and the second pixel definition layer are formed at one time by a halftone mask process.

Optionally, the first pixel definition layer and the second pixel definition layer are disposed in a same layer.

The above description is merely a summary of the technical solutions of the present disclosure. In order to more clearly know the elements of the present disclosure to enable the implementation according to the contents of the description, and in order to make the above and other purposes, features, and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the prior art, the figures that are required to describe the embodiments or the prior art will be briefly introduced below. Apparently, the figures that are described below are embodiments of the present disclosure, and a person skilled in the art can obtain other figures according to these figures without paying creative work. It should be noted that the ratios in the drawings are merely illustrative and do not represent actual ratios.

DETAILED DESCRIPTION OF THE EMBODIMENTS

In order to make the objects, the features, and the advantages of the embodiments of the present disclosure clearer, the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

Figure 1:
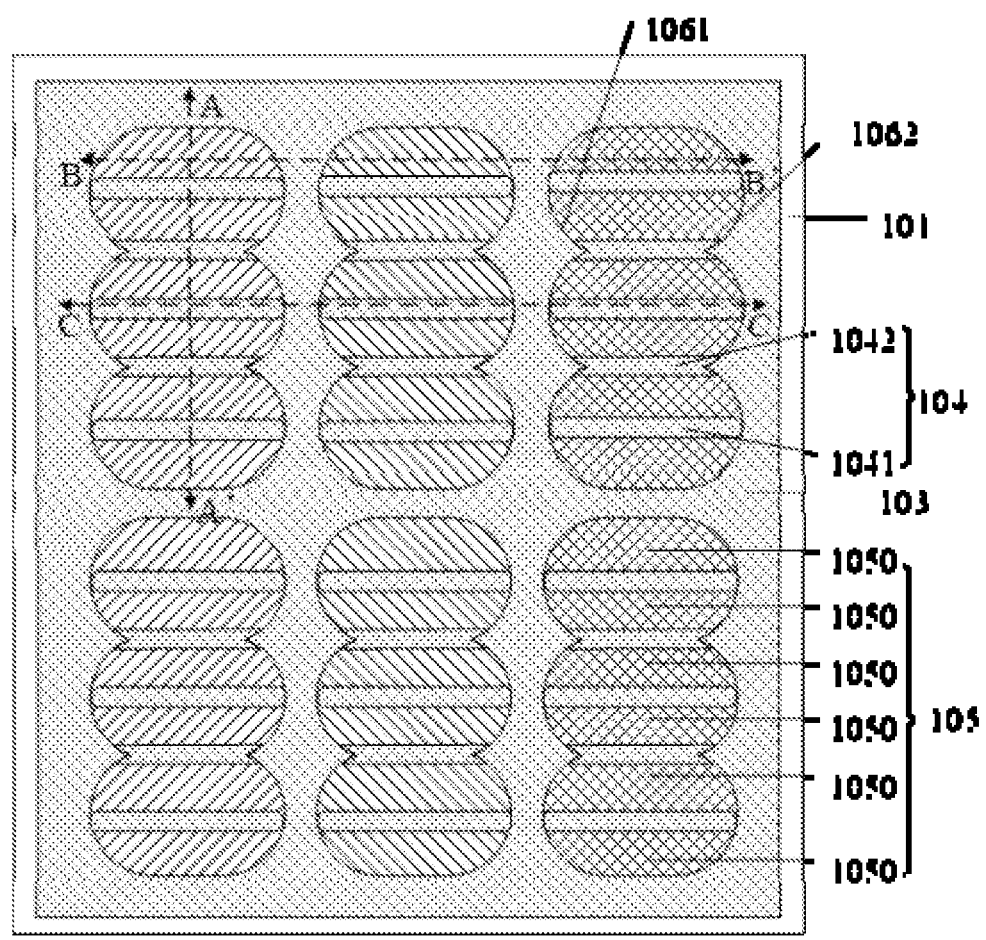
FIG. 1 illustrates a structural schematic diagram of the first display base plate according to an embodiment of the present disclosure.
Figure 2:
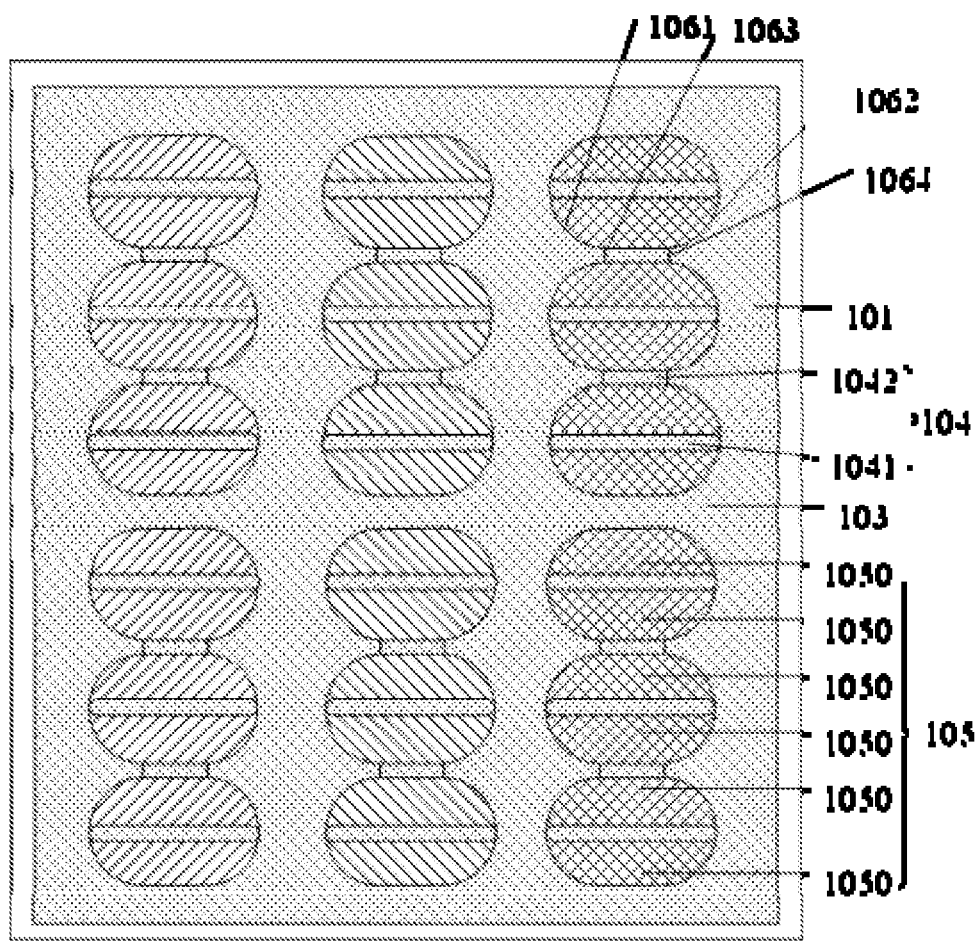
FIG. 2 illustrates a structural schematic diagram of the second display base plate according to an embodiment of the present disclosure.
Figure 3:
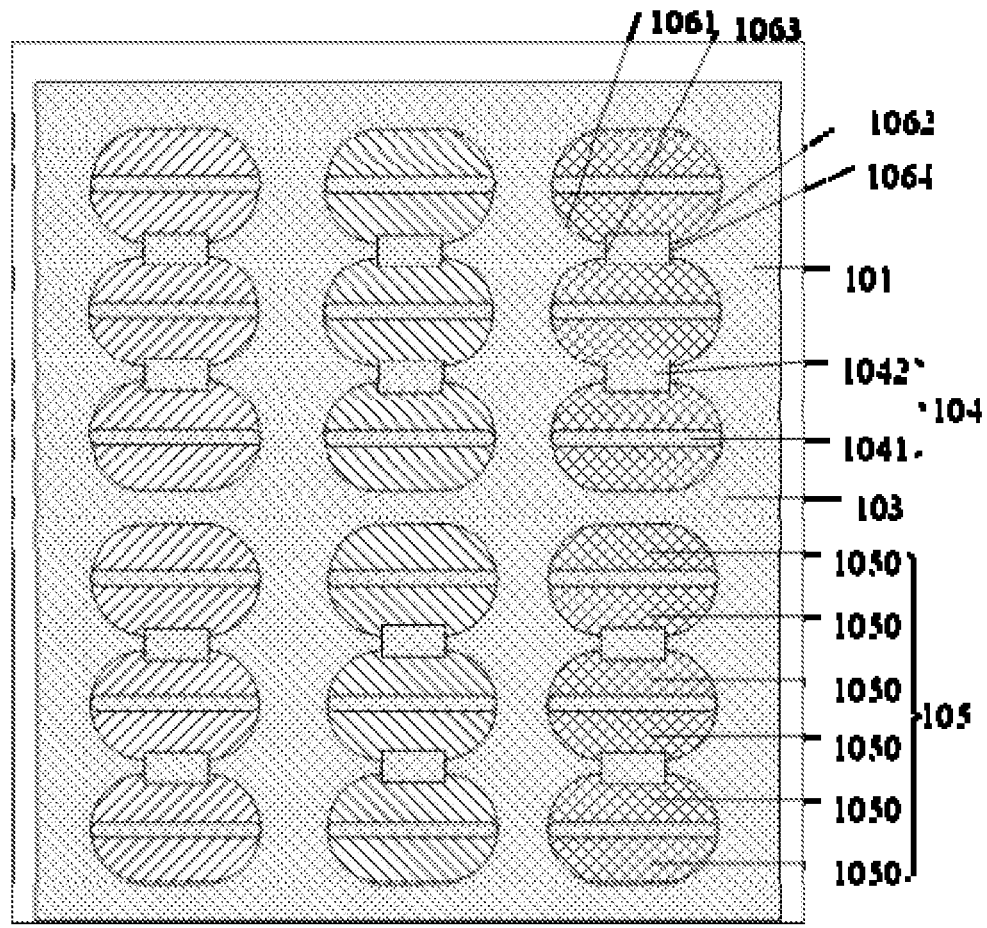
FIG. 3 illustrates a structural schematic diagram of the third display base plate according to an embodiment of the present disclosure.
Figure 4:
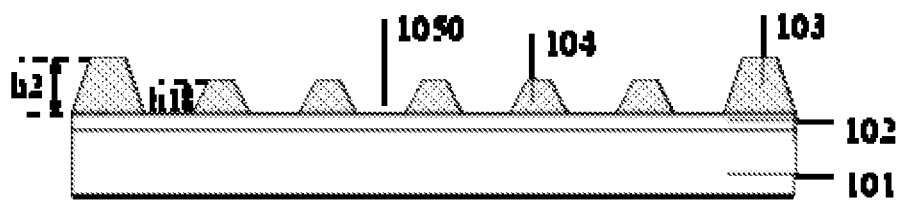
FIG. 4 illustrates a partial cross-sectional view of the display base plate shown in FIG. 1 along the section A-A'.
Figure 5:
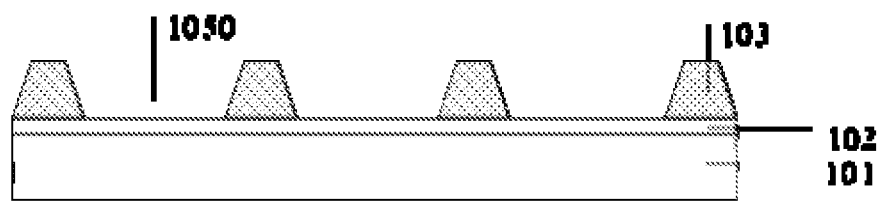
FIG. 5 illustrates a partial cross-sectional view of the display base plate shown in FIG. 1 along the section B-B'.
Figure 6:
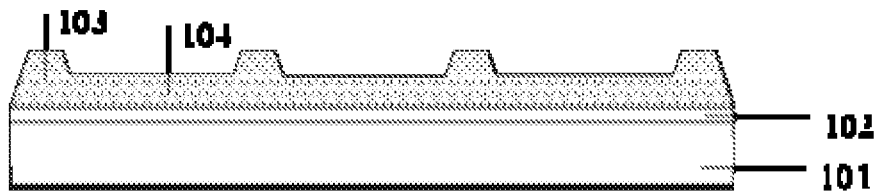
FIG. 6 illustrates a partial cross-sectional view of the display base plate shown in FIG. 1 along the section C-C'.

Referring to FIG. 1, FIG. 1 illustrates a structural schematic diagram of the first display base plate according to an embodiment of the present disclosure, FIG. 2 illustrates a structural schematic diagram of the second display base plate according to an embodiment of the present disclosure, FIG. 3 illustrates a structural schematic diagram of the third display base plate according to an embodiment of the present disclosure, FIG. 4 illustrates a partial cross-sectional view of the display base plate shown in FIG. 1 along the section A-A', FIG. 5 illustrates a partial cross-sectional view of the display base plate shown in FIG. 1 along the section B-B', FIG. 6 illustrates a partial cross-sectional view of the display base plate shown in FIG. 1 along the section C-C'.

The present disclosure provides a display base plate, and the display base plate includes: a substrate 101, a first electrode layer 102 formed on the substrate 101, and a first pixel definition layer 103 and a second pixel definition layer 104 formed on the first electrode layer 102; the first pixel definition layer 103 divides the substrate 101 into a plurality of pixel regions 105, each of the plurality of pixel regions 105 includes a plurality of subpixel regions 1050 distributed along a first direction, and two adjacent instances of the plurality of subpixel regions 1050 are separated by the second pixel definition layer 104; and in the first direction, surfaces of each of the plurality of pixel regions 105 in contact with the first pixel definition layer 103 include a plurality of first curved surfaces 1061 and a plurality of second curved surfaces 1062, the plurality of first curved surfaces 1061 are connected to each other, the plurality of second curved surfaces 1062 are connected to each other, and the plurality of first curved surfaces 1061 and the plurality of second curved surfaces 1062 are protruded away from the pixel region 105 to which they belong.

In the embodiment of the present disclosure, the substrate 101 is actually a structure including a first substrate, a driving transistor formed on the first substrate, and a planarization layer covering the driving transistor. The first substrate may be a glass substrate, a quartz substrate, a metal substrate, a resin substrate, etc.; the driving transistor includes a gate formed on the first substrate, a gate insulating layer covering the gate and the first substrate, and an active layer formed on the gate insulating layer, a source-drain electrode layer partially covering the gate insulating layer and the active layer, and a passivation layer covering the source-drain electrode layer, the active layer and the gate insulating layer, the source-drain electrode layer including a source electrode and a drain electrode; the planarization layer is actually the passivation layer that covers the driving transistor.

It should be noted that, the driving transistor of the embodiment of the present disclosure may not be limited to the above-mentioned structures, and other structures may also be applicable to this solution, such as a driving transistor with a double gate structure or a driving transistor with a top gate structure; in addition, the material of the planarization layer may be a resin material.

After the substrate 101 is formed, the first electrode layer 102 is formed on the substrate 101. In order to simplify the drawing of the first electrode layer 102, the cross-sectional views shown in FIG. 4 to FIG. 6 depict the first electrode layer 102 as a full-surface electrode. It can be understood that, the first electrode layer 102 in the embodiment of the present disclosure includes a plurality of first electrodes that are insulated from each other and distributed in an array. The first electrodes are connected to the drain electrodes of the driving transistors through vias penetrating through the planarization layer and the passivation layer, and the first electrodes are an anode of a subpixel to drive the corresponding subpixel to emit light. Specifically, the material of the first electrode layer 102 is a transparent conductive material, such as indium tin oxide (ITO), and the shape of the plurality of first electrodes included in the first electrode layer 102 is consistent with the shape of the subsequently formed subpixel regions.

After the first electrode layer 102 is formed on the substrate 101, the first pixel definition layer 103 and the second pixel definition layer 104 are formed on the first electrode layer 102, and the first pixel definition layer 103 and the second pixel definition layer 104 are disposed in the same layer. The first pixel definition layer 103 divides the substrate 101 into a plurality of pixel regions 105, and each pixel region 105 includes a plurality of subpixel regions 1050 distributed along the first direction. In the first direction, the surfaces of each pixel region 105 in contact with the first pixel definition layer 103 are set to a plurality of first curved surfaces 1061 and a plurality of second curved surfaces 1062, the plurality of first curved surfaces 1061 are connected to each other, and the plurality of second curved surfaces 1062 are connected to each other, and both the first curved surfaces 1061 and the second curved surfaces 1062 are protruded away from the pixel region 105 to which they belong, so that on a plane parallel to the substrate 101, the width of the subpixel regions 105 increases along the second direction perpendicular to the first direction.

In other words, for the same pixel region 105, the corresponding first curved surfaces 1061 and second curved surfaces 1062 are protruded away from the pixel region 105, and the first curved surfaces 1061 and second curved surfaces 1062 corresponding to the pixel region 105 are set to protrude toward a pixel region 105 adjacent to the pixel region 105 in the second direction.

For example, for the pixel region 105 in the first row and the second column in FIG. 1, the corresponding first curved surfaces 1061 and the corresponding second curved surfaces 1062 are both protruded away from the pixel region 105 in the first row and the second column, and the first curved surfaces 1061 corresponding to the pixel regions 105 in the first row and the second column are set to protrude toward the pixel region 105 in the first row and the first column, and the second curved surfaces 1062 corresponding to the pixel regions 105 in the first row and the second column are set to protrude toward the pixel region 105 in the first row and the third column.

Figure 7:
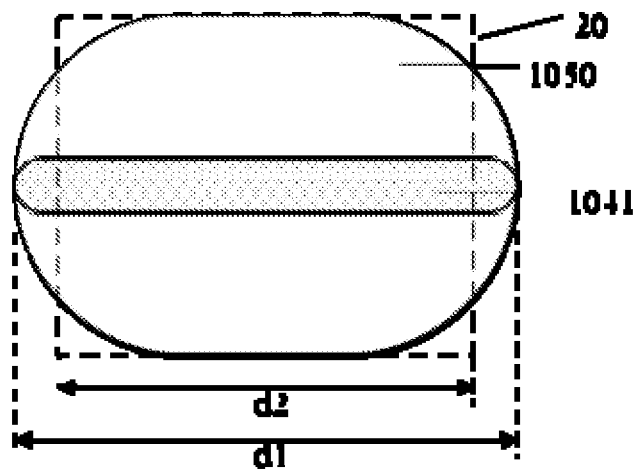
FIG. 7 illustrates a structural comparison diagram of a subpixel region according to an embodiment of the present disclosure and a subpixel region in related art.

For the relevant display base plate, the display base plate may be divided into a plurality of isolated subpixel regions through the pixel definition layer. When printing organic functional materials, one nozzle corresponds to inkjet printing in one subpixel region; the related base plate may also be divided into a plurality of pixel regions with a linear distribution through the first pixel definition layer, and then divided into a plurality of subpixel regions through the second pixel definition layer in the pixel regions (ie, the line bank structure). When printing organic functional materials, one nozzle corresponds to one pixel region, and the plurality of subpixel regions in the pixel region are simultaneously inkjet printed. However, no matter what kind of related display base plate it is, the shape of its corresponding subpixel region 20 is a rectangle, as shown in FIG. 7, and its width along the second direction is d2, while the width of each subpixel region 1050 in the embodiment of the present disclosure along the second direction is d1, when the subpixel regions have the same area, the width of each subpixel region 1050 in the embodiment of the present disclosure increases along the second direction relative to the related subpixel region 20, that is, the width d1 is greater than the width d2, and when inkjet printing is performed within the pixel regions 105 subsequently, the uniformity of film formation along the second direction within each subpixel region 1050 is improved.

In addition, in the embodiment of the present disclosure, two adjacent subpixel regions 1050 are separated by the second pixel definition layer 104, and each pixel region 105 includes a plurality of subpixel regions 1050 distributed along the first direction. Then, when inkjet printing is performed in the pixel regions 105, the organic functional material flows into each subpixel region 1050 along the first direction, and the organic functional material will be evenly distributed in each subpixel region 1050 along the first direction. After the organic functional material is dried, only the organic functional material at the most marginal position of the first direction will climb on the first pixel definition layer 103, the organic functional material at the middle position is uniformly formed into a film, and the uniformity of the film formation in each subpixel region 1050 distributed linearly along the first direction in the embodiment of the present disclosure is also improved.

As shown in FIG. 1 to FIG. 3, the first direction is the column direction of the substrate 101, then the second direction is the row direction of the substrate 101; certainly, the first direction may also be the row direction of the substrate 101, then the second direction is the column direction of the substrate 101.

Thereinto, the first curved surfaces 1061 and the second curved surfaces 1062 are set opposite to each other, and the orthographic projections of the first curved surfaces 1061 and the second curved surfaces 1062 on the substrate 101 are circular arcs. For any pixel region 105, the quantities of its corresponding first curved surfaces 1061 and its corresponding second curved surfaces 1062 are equal, and the radii of curvature corresponding to the orthographic projections of the first curved surfaces 1061 and the second curved surfaces 1062 on the substrate 101 are equal.

Further, the quantity of the first curved surfaces 1061 and the second curved surfaces 1062 of each pixel region 105 in contact with the first pixel definition layer 103 is greater than or equal to two.

As shown in FIG. 1 to FIG. 3, the quantity of the first curved surfaces 1061 and the second curved surfaces 1062 of each pixel region 105 in contact with the first pixel definition layer 103 is three. Certainly, the quantity of the first curved surfaces 1061 and the second curved surfaces 1062 of each pixel region 105 in contact with the first pixel definition layer 103 may also be 2, 4, 5, etc.

In the embodiment of the present disclosure, as shown in FIG. 1 to FIG. 3, the second pixel definition layer 104 includes a first pixel definition structure 1041 and a second pixel definition structure 1042 disposed in each pixel region 105; the first pixel definition structure 1041 is disposed between the first curved surfaces 1061 and the first curved surfaces 1062, and is located at the maximum spacing between the first curved surface 1061 and the second curved surface 1062 along the second direction, wherein the second direction is perpendicular to the first direction; one end of the second pixel definition structure 1042 is located at the connection position of the two adjacent first curved surfaces 1061, the other end of the second pixel definition structure 1042 is located at the connection position of the two adjacent second curved surfaces 1062, and the line connecting the two ends of the second pixel definition structure 1042 is located in the second direction.

Each pixel region 105 is divided into a plurality of subpixel regions 1050 by the first pixel definition structure 1041 and the second pixel definition structure 1042, so that in the same area, compared with the display base plate where the first pixel definition structure 1041 or the second pixel definition structure 1042 is only set in the pixel region 105, the display base plate according to the embodiment of the present disclosure has a higher PPI (Pixels Per Inch, the quantity of pixels per inch).

Moreover, the first pixel definition structure 1041 is set at the maximum spacing along the second direction between the first curved surface 1061 and the second curved surface 1062, and the second pixel definition structure 1042 is set at the connection position of the first curved surfaces 1061 and the connection position of the second curved surfaces 1062 (ie, the minimum spacing between the first curved surface 1061 and the second curved surface 1062 along the second direction), so that when using the nozzle of the inkjet printing device to print the organic functional material along the central axis of the first direction in the pixel regions 105, the distances between the inkjet printing positions and each edge position of the subpixel regions 1050 are substantially equal, which further improves the uniformity of film formation in each subpixel region 1050.

In addition, the second pixel definition structure 1042 is disposed at the connection position of the two first curved surfaces 1061 and the connection position of the two second curved surfaces 1062, so that the width of the connection part of the subpixel regions 1050 is narrowed, the flow speed of the organic functional material between the subpixel regions 1050 may be adjusted, which may further improve the uniformity of film formation of each subpixel region 1050; for the related line bank structure, when printing organic functional materials, the flow speed of the organic functional material between the subpixel regions is larger, when there are impurity particles (particles) exist in the subpixel regions, the organic functional material is easy to aggregate around the particles, resulting in uneven film formation. In the embodiment of the present disclosure, by narrowing the width of the connection part of the subpixel regions 1050, the flow speed of the organic functional material between the subpixel regions 1050 may be adjusted. Therefore, the aggregation problem of the organic functional materials caused by particles may also be improved, and the uniformity of film formation may be further improved.

As shown in FIG. 1, for the same pixel region 105, any two adjacent first curved surfaces 1061 are directly connected, and any two adjacent second curved surfaces 1062 are directly connected; the second pixel definition structure 1042 contacts with the first curved surfaces 1061 and the second curved surfaces 1062, respectively, and is located at the minimum spacing between the first curved surface 1061 and the second curved surface 1062 along the second direction.

In any pixel region 105, when any two adjacent first curved surfaces 1061 are directly connected, and any two adjacent second curved surfaces 1062 are directly connected, the orthographic projection of the second pixel definition structure 1042 on the substrate 101 includes a first straight line segment and a second straight line segment arranged parallel to each other, and a first connecting line and a second connecting line arranged between the first straight line segment and the second straight line segment and connected to the first straight line segment and the second straight line segment, respectively, both the first connecting line and the second connecting line include two arc segments connected to each other, and the first connecting line and the second connecting line are recessed in the direction toward the pixel region 105 to which they belong.

As shown in FIG. 2 and FIG. 3, for the same pixel region 105, any two adjacent first curved surfaces 1061 are connected by a first connection part 1063, and any two adjacent second curved surfaces 1062 are connected by a second connection part 1064; the second pixel definition structure 1042 is respectively in connect with the first connection part 1063 and the second connection part 1064; the orthographic projections of first connection part 1063 and second connection part 1064 on the substrate 101 are straight line segments distributed along the first direction.

In any pixel region 105, when any two adjacent first curved surfaces 1061 are connected by the first connection part 1063, and any two adjacent second curved surfaces 1062 are connected by the second connection part 1064, the orthographic projection of the second pixel definition structure 1042 on the substrate 101 is a rectangle.

It should be noted that, for the display base plate with the same PPI, the aperture ratio of the subpixel regions 1050 of the display base plate shown in FIG. 1 is greater than the aperture ratio of the subpixel regions 1050 of the display base plate shown in FIG. 2 and FIG. 3.

Wherein, in the first direction, the width of the second pixel definition structure 1042 is greater than or equal to the widths of the first connection part 1063 and the second connection part 1064. As shown in FIG. 2, the width of the second pixel definition structure 1042 is equal to the width of the first connection part 1063 and the second connection part 1064. As shown in FIG. 3, the width of the second pixel definition structure 1042 is greater than the width of the first connection part 1063 and the second connection part 1064.

In the embodiment of the present disclosure, in the direction perpendicular to the substrate 101, the thickness h1 of the second pixel definition layer 104 is less than the thickness h2 of the first pixel definition layer 103.

Specifically, the thickness h2 of the first pixel definition layer 103 is 1.5 μm to 3 μm, and the thickness h1 of the second pixel definition layer 104 is less than or equal to 1 μm.

By controlling the thickness h1 of the second pixel definition layer 104 to be less than the thickness h2 of the first pixel definition layer 103, when the organic functional material is printed in the pixel regions 105 defined by the first pixel definition layer 103, the organic functional material may flow over the second pixel definition layer 104 and flow into each subpixel region 1050. It can ensure that the organic functional material will not flow from the first pixel definition layer 103 to other adjacent pixel regions.

In the embodiment of the present disclosure, the organic functional material includes a luminescent material. For each pixel region 105 distributed along the first direction, the luminescent material with the same color can be printed, while for each pixel region 105 distributed along the second direction, the colors of the printed luminescent materials are different. For example, for the pixel regions 105 in the first column shown in FIG. 1 to FIG. 3, which can print red luminescent materials; for pixel regions 105 in the second column shown in FIG. 1 to FIG. 3, which can print green luminescent materials; for pixel regions 105 in the third column shown in FIG. 1 to FIG. 3, which can print blue luminescent materials. The color of the luminescent material printed in each subpixel region 1050 in each pixel region 105 is the same color.

In the embodiment of the present disclosure, the surfaces of the pixel regions in contact with the first pixel definition layer are set as multiple first curved surfaces and multiple second curved surfaces, and both the first curved surfaces and the second curved surfaces are protruded away from the pixel region to which they belong, so that on the plane parallel to the substrate, the width of the subpixel regions increases along the second direction perpendicular to the first direction. When inkjet printing is performed in the pixel regions, the organic functional material flows into each subpixel region along the first direction, so that the film formation uniformity along the first direction and the second direction in the subpixel regions is improved, thereby improving the luminance uniformity of the luminescence device.

An embodiment of the present disclosure also provides a display panel, which includes the above-mentioned display base plate.

For the specific description of the display base plate, reference may be made to the description of the above embodiment, which is not repeated in this embodiment of the present disclosure.

In the embodiment of the present disclosure, the display panel further includes an organic functional layer formed in each subpixel region 1050, a cathode covering the organic functional layer, the first pixel definition layer 103 and the second pixel definition layer 104, and an encapsulation layer.

In an embodiment of the present disclosure, the organic functional layer only includes a luminescence layer, and the luminescent material is printed in each pixel region 105 by inkjet printing, and the luminescent material flows into each subpixel region 1050, and forms the luminescence layer after drying and baking.

In another embodiment of the present disclosure, the organic functional layer includes a hole injection layer, a hole transport layer, a luminescence layer, an electron transport layer, and an electron injection layer. Hole injection material, hole transport material, luminescent material, electron transport material and electron injection material are sequentially printed in each pixel region 105 by inkjet printing, and after drying and baking process, the hole injection layer, the hole transport layer, the luminescence layer, the electron transport layer, and the electron injection layer are sequentially formed in each subpixel region 1050 of the pixel regions 105.

After that the hole injection layer, the hole transport layer, the luminescence layer, the electron transport layer, and the electron injection layer are sequentially formed in each subpixel region 1050 of the pixel regions 105, a second electrode layer is formed, the second electrode is a cathode, and finally, the display base plate formed with the cathode is packaged to obtain a display panel.

An embodiment of the present disclosure further provides a display apparatus, including the above-mentioned display panel.

In practical applications, the display apparatus may be any product or component with a display function, such as a mobile phone, a tablet computer, a television, a monitor, a notebook computer, and an avigraph.

In the embodiment of the present disclosure, the surfaces of the pixel regions in contact with the first pixel definition layer are set as multiple first curved surfaces and multiple second curved surfaces, and both the first curved surfaces and the second curved surfaces are protruded away from the pixel region to which they belong, so that on the plane parallel to the substrate, the width of the subpixel regions increases along the second direction perpendicular to the first direction. When inkjet printing is performed in the pixel regions, the organic functional material flows into each subpixel region along the first direction, so that the film formation uniformity along the first direction and the second direction in the subpixel regions is improved, thereby improving the luminance uniformity of the luminescence device.

Figure 8:
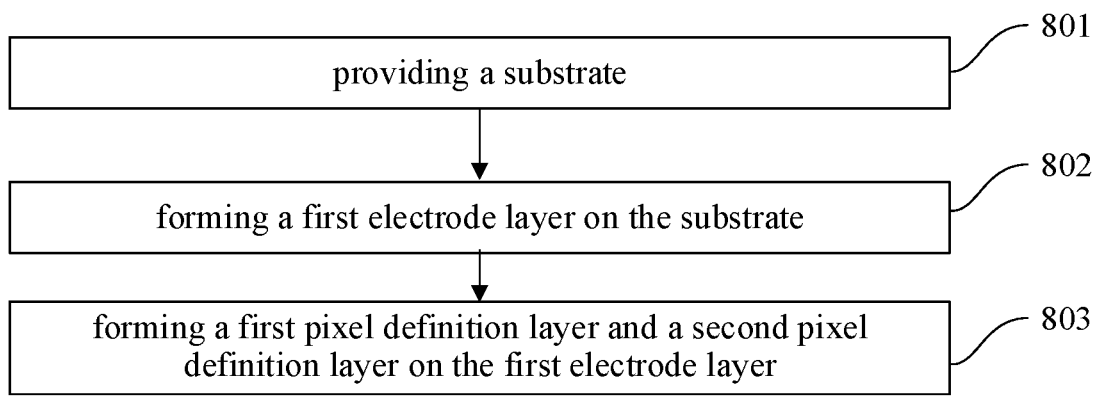
FIG. 8 illustrates a flow chart of a manufacturing method of a display base plate according to an embodiment of the present disclosure.

Referring to FIG. 8, FIG. 8 illustrates a flow chart of a manufacturing method of a display base plate according to an embodiment of the present disclosure, specifically may include the following steps:

step 801, providing a substrate.

In the embodiment of the present disclosure, the substrate 101 is first manufactured. Specifically, a first substrate is first provided, a gate is formed on the first substrate by a patterning process, then a gate insulating layer covering the gate and the first substrate is formed, an active layer is formed on the gate insulating layer by the patterning process, and then, a source-drain electrode layer partially covering the gate insulating layer and the active layer is formed by using the patterning process. The source-drain electrode layer includes a source electrode and a drain electrode, and then a passivation layer covering the source-drain electrode layer, the active layer and the gate insulating layer is formed. Finally, a planarization layer is formed on the passivation layer to obtain the substrate 101.

Step 802, forming a first electrode layer on the substrate.

In the embodiment of the present disclosure, after the substrate 101 is manufactured, the first electrode layer 102 is formed on the substrate 101 by using the patterning process. Specifically, a first electrode film is deposited on the substrate 101, a photoresist is coated on the first electrode film, a mask is used to expose and develop the photoresist on the first electrode film. Then, the first electrode film uncovered with the photoresist film is etched away, finally, the remaining photoresist on the first electrode film is removed to obtain the first electrode layer 102.

Step 803, forming a first pixel definition layer and a second pixel definition layer on the first electrode layer.

In the embodiment of the present disclosure, after the first electrode layer 102 is formed on the substrate 101, the first pixel definition layer 103 and the second pixel definition layer 104 are formed on the first electrode layer 102 by using the patterning process. The material of the first pixel definition layer 103 and the second pixel definition layer 104 may be polyamide imine.

Specifically, a pixel definition film is coated on the first electrode layer 102, and a halftone mask is used to expose and develop the pixel definition film, so that the first pixel definition layer 103 and the second electrode pixel definition layer 104 can be obtained at the same time. That is, the first pixel definition layer 103 and the second pixel definition The layer 104 is formed once by a halftone mask process.

In the halftone mask, the regions corresponding to the first pixel definition layer 103 and the second pixel definition layer 104 have different light transmittances, so the first pixel definition layer 103 and the second pixel definition layer 104 with different heights can be obtained.

Wherein, the first pixel definition layer 103 divides the substrate 101 into a plurality of pixel regions 105, each pixel region 105 includes a plurality of subpixel regions 1050 distributed along the first direction, and two adjacent subpixel regions 1050 are separated by the second pixel definition layer 104; in the first direction, the surfaces of each pixel region 105 in contact with the first pixel definition layer 103 include a plurality of first curved surfaces 1061 and a plurality of second curved surfaces 1062, the plurality of first curved surfaces 1061 are connected to each other, the plurality of second curved surfaces 1062 are connected to each other, and both the first curved surfaces 1061 and the second curved surfaces 1062 are protruded away from the pixel region 105 to which they belong.

In the embodiment of the present disclosure, the surfaces of the pixel regions in contact with the first pixel definition layer are set as multiple first curved surfaces and multiple second curved surfaces, and both the first curved surfaces and the second curved surfaces are protruded away from the pixel region to which they belong, so that on the plane parallel to the substrate, the width of the subpixel regions increases along the second direction perpendicular to the first direction. When inkjet printing is performed in the pixel regions, the organic functional material flows into each subpixel region along the first direction, so that the film formation uniformity along the first direction and the second direction in the subpixel regions is improved, thereby improving the luminance uniformity of the luminescence device.

The foregoing method embodiments are described as a series of action combinations for the sake of simplicity, but those skilled in the art should know that the present disclosure is not limited by the described action sequences, because according to the present disclosure, certain steps may be performed in other orders or simultaneously. Secondly, those skilled in the art should also know that the embodiments described in the specification are all preferred embodiments, and the actions and modules involved are not necessarily required by the present disclosure.

The embodiments of the description are described in the mode of progression, each of the embodiments emphatically describes the differences from the other embodiments, and the same or similar parts of the embodiments may refer to each other.

Finally, it should also be noted that, in the present text, relation terms such as first and second are merely intended to distinguish one entity or operation from another entity or operation, and that does not necessarily require or imply that those entities or operations have therebetween any such actual relation or order. Furthermore, the terms "include", "comprise" or any variants thereof are intended to cover non-exclusive inclusions, so that processes, methods, articles, or devices that include a series of elements do not only include those elements, but also include other elements that are not explicitly listed, or include the elements that are inherent to such processes, methods, articles, or devices. Unless further limitation is set forth, an element defined by the wording "comprising a . . . " does not exclude additional same element in the process, method, article, or device comprising the element.

The display base plate and the manufacturing method thereof, the display panel, and the display apparatus according to the present disclosure have been described in detail above. The principle and the embodiments of the present disclosure are described herein with reference to the particular examples, and the description of the above embodiments is merely intended to facilitate to understand the method according to the present disclosure and its core concept. Moreover, for a person skilled in the art, according to the concept of the present disclosure, the particular embodiments and the range of application may be varied. In conclusion, the contents of the description should not be understood as limiting the present disclosure.

The invention claimed is:

1. A display base plate, wherein the display base plate comprises: a substrate, a first electrode layer formed on the substrate, and a first pixel definition layer and a second pixel definition layer formed on the first electrode layer;
   the first pixel definition layer divides the substrate into a plurality of pixel regions, each of the plurality of pixel regions comprises a plurality of subpixel regions distributed along a first direction, and two adjacent instances of the plurality of subpixel regions are separated by the second pixel definition layer; and
   in the first direction, surfaces of each of the plurality of pixel regions in contact with the first pixel definition layer comprise a plurality of first curved surfaces and a plurality of second curved surfaces, for a same pixel region, any two adjacent instances of the plurality of first curved surfaces are connected directly, and two adjacent instances of the plurality of second curved surfaces are connected directly; or any two adjacent instances of the plurality of first curved surfaces are connected by a first connection part, any two adjacent instances of the plurality of second curved surfaces are connected by a second connection part;
   the first curved surfaces and second curved surfaces corresponding to each pixel region are set to protrude toward another pixel region adjacent to the pixel region in a second direction that is perpendicular to the first direction;
   wherein the second pixel definition layer comprises first pixel definition structures and second pixel definition structures disposed in each of the plurality of pixel regions;
   each of the first pixel definition structures is disposed between the first curved surface and the second curved surface, and located at a maximum spacing between the first curved surface and the second curved surface along the second direction; and
   one end of each of the second pixel definition structures is located at a connection position of two adjacent instances of the plurality of first curved surfaces, the other end of each of the second pixel definition structures is located at a connection position of two adjacent instances of the plurality of second curved surfaces, and a line connecting two ends of each of the second pixel definition structures is located in the second direction.

2. The display base plate according to claim 1, wherein the two ends of each of the second pixel definition structures are in contact with the first curved surface and the second curved surface, and located at a minimum spacing between the first curved surface and the second curved surface along the second direction.

3. The display base plate according to claim 1, wherein the two ends of each of the second pixel definition structures are contact with the first connection part and the second connection part;
wherein, orthographic projections of the first connection part and the second connection part on the substrate are straight line segments distributed along the first direction.

4. The display base plate according to claim 3, wherein in the first direction, a width of each of the second pixel definition structures is greater than or equal to widths of the first connection part and the second connection part.

5. The display base plate according to claim 1, wherein in a direction perpendicular to the substrate, and a thickness of the second pixel definition layer is less than a thickness of the first pixel definition layer.

6. The display base plate according to claim 5, wherein the thickness of the first pixel definition layer is 1.5 μm to 3 μm, and the thickness of the second pixel definition layer is less than or equal to 1 μm.

7. The display base plate according to claim 1, wherein quantities of the first curved surfaces and the second curved surfaces of each of the plurality of pixel regions in contact with the first pixel definition layer are greater than or equal to 2.

8. The display base plate according to claim 1, wherein the first curved surfaces and the second curved surfaces are disposed correspondingly, and orthographic projections of the first curved surfaces and the second curved surfaces on the substrate are circular arc shapes.

9. The display base plate according to claim 8, wherein for a same pixel region, quantities of the first curved surfaces and the second curved surfaces are equal, and radiuses of curvature corresponding to the orthographic projections of the first curved surfaces and the second curved surfaces on the substrate are equal.

10. A display panel, wherein the display panel comprises the display base plate according to claim 1.

11. The display panel according to claim 10, wherein the display panel further comprises an organic functional layer formed in each of the plurality of subpixel regions, a cathode covering the organic functional layer, the first pixel definition layer and the second pixel definition layer, and an encapsulation layer.

12. A display apparatus, wherein the display apparatus comprises the display panel according to claim 10.

13. A manufacturing method of a display base plate, wherein the method comprises:
providing a substrate;
forming a first electrode layer on the substrate;
forming a first pixel definition layer and a second pixel definition layer on the first electrode layer;
wherein, the first pixel definition layer divides the substrate into a plurality of pixel regions, each of the plurality of pixel regions comprises a plurality of subpixel regions distributed along a first direction, and two adjacent instances of the plurality of subpixel regions are separated by the second pixel definition layer; in the first direction, surfaces of each of the plurality of pixel regions in contact with the first pixel definition layer comprise a plurality of first curved surfaces and a plurality of second curved surfaces, for a same pixel region, any two adjacent instances of the plurality of first curved surfaces are connected directly, and two adjacent instances of the plurality of second curved surfaces are connected directly; or any two adjacent instances of the plurality of first curved surfaces are connected by a first connection part, any two adjacent instances of the plurality of second curved surfaces are connected by a second connection part; and the first curved surfaces and second curved surfaces corresponding to each pixel region are set to protrude toward another pixel region adjacent to the pixel region in a second direction that is perpendicular to the first direction;

wherein the second pixel definition layer comprises first pixel definition structures and second pixel definition structures disposed in each of the plurality of pixel regions;

each of the first pixel definition structures is disposed between the first curved surface and the second curved surface, and located at a maximum spacing between the first curved surface and the second curved surface along the second direction; and one end of each of the second pixel definition structures is located at a connection position of two adjacent instances of the plurality of first curved surfaces, the other end of each of the second pixel definition structures is located at a connection position of two adjacent instances of the plurality of second curved surfaces, and a line connecting two ends of each of the second pixel definition structures is located in the second direction.

14. The method according to claim 13, wherein the first pixel definition layer and the second pixel definition layer are formed at one time by a halftone mask process.

15. The method according to claim 13, wherein the first pixel definition layer and the second pixel definition layer are disposed in a same layer.

16. The display panel according to claim 13, wherein
the two ends of each of the second pixel definition structures are in contact with the first curved surface and the second curved surface, and located at a minimum spacing between the first curved surface and the second curved surface along the second direction.

17. The display panel according to claim 13, wherein the two ends of each of the second pixel definition structures are contact with the first connection part and the second connection part;
wherein, orthographic projections of the first connection part and the second connection part on the substrate are straight line segments distributed along the first direction.

18. The display panel according to claim 17, wherein in the first direction, a width of each of the second pixel definition structures is greater than or equal to widths of the first connection part and the second connection part.

* * * * *